(12) United States Patent
Maier

(10) Patent No.: US 9,028,791 B1
(45) Date of Patent: May 12, 2015

(54) SYSTEM AND METHOD FOR MANUFACTURING CARBON NANOTUBES

(71) Applicant: Joel Maier, Covington, LA (US)

(72) Inventor: Joel Maier, Covington, LA (US)

(73) Assignee: Dream Matter, LLC, Covington, LA (US)

( * ) Notice: Subject to any disclaimer, the term of this patent is extended or adjusted under 35 U.S.C. 154(b) by 242 days.

(21) Appl. No.: 13/686,546

(22) Filed: Nov. 27, 2012

(51) Int. Cl.
*D01F 9/127* (2006.01)
*D01F 9/133* (2006.01)
*B01J 19/08* (2006.01)
*C01B 31/00* (2006.01)
*C01B 31/02* (2006.01)
*B82Y 40/00* (2011.01)

(52) U.S. Cl.
CPC .............. *B01J 19/087* (2013.01); *B82Y 40/00* (2013.01); *C01B 31/00* (2013.01); *C01B 31/0226* (2013.01); *Y10S 977/742* (2013.01); *Y10S 977/843* (2013.01)

(58) Field of Classification Search
CPC  B01J 19/088; B01J 2219/0809; B01D 53/32; F01N 3/0892; H05H 1/24; D01F 9/133; D01F 9/127
USPC .............................. 422/186.04; 118/620–623; 423/447.1–447.3, 445 B; 977/742–754, 977/842–848; 428/367
See application file for complete search history.

(56) References Cited

U.S. PATENT DOCUMENTS 4,411,733 A * 10/1983 Macklin et al. .................. 216/71
2005/0233263 A1* 10/2005 Park et al. ...................... 430/324

OTHER PUBLICATIONS

Dittmer, S., et al; "Electric field aligned growth of single-walled carbon nanotubes"; Current Applied Physics 4 (2004); pp. 595-598.
McCartney, M.R. and Spence, J.C.H.; "Electron Holography of Field-Emitting Carbon Nanotubes"; Physical Review Letters, vol. 88, No. 5, Feb. 4, 2002, pp. 056804-1-056804-4.
Ng, Hou T., et al; "Growth of Carbon Nanotubes: A Combinatorial Method to Studythe Effects of Catalysts and Underlayers"; J. Phys. Chem. B 2003, 107, pp. 8484-8489.
Merlino, Robert L.; "Understanding Langmuir probe current-voltage characteristics"; Am. J. Phys. 75 (12), Dec. 2007; pp. 1078-1085.
Melechko, A.V., et al "Vertically aligned carbon nanofibers and related structures"; Controlled synthesis and directed assembly; Journal of Applied Physics 97, 041301 (2005); pp. 1-39.
Frank, Stefan, et al "Carbon Nanotube Quantum Resistors" Science 280, 1744 (1998); pp. 1744-1746.
Ren, Z.F., et al "Synthesis of Large Arrays of Well-Aligned Carbon Nanotubes on Glass"; Science 282, 1105 (1998); pp. 1105-1107.

(Continued)

*Primary Examiner* — Daniel C McCracken

(74) *Attorney, Agent, or Firm* — Roy Kiesel Ford Doody & Thurmon

(57) ABSTRACT

A system and method for manufacturing carbon nanotubes using chemical vapor deposition. The system has a first chamber comprising at least one cathode and at least one anode, a gas supply source, at least one activation energy source, at least one alignment energy source, a second chamber situated within said first chamber, said second chamber comprising: a target growth plate, comprising a catalyst and a substrate, a second cathode configured to support said target growth plate, a movable platform configured to support said second cathode, and a gas permeable barrier vertically opposed from said second cathode.

34 Claims, 9 Drawing Sheets

(56) References Cited

OTHER PUBLICATIONS

Boskovic, Bojan O., et al; "Large-area synthesis of carbon nanofibres at room temperature"; Nature Materials, vol. 1, Nov. 2002, pp. 165-168.

Hata, Kenji, et al; "Water-Assisted Highly Efficient Synthesis of Impurity-Free Single-Walled Carbon Nanotubes"; Science 306, 1362 (2004); pp. 1362-1364.

Taschner, Ch., et al; "Synthesis of aligned carbon nanotubes by DC plasma-enhanced hot filament CVD"; Surface and Coatings Technology 174-175 (2003) 81-87.

Teo, K.B.K., et al; "Uniform patterned growth of carbon nanotubes without surface carbon"; Applied Physics Letters, vol. 79, No. 10, Sep. 3, 2001, pp. 154-1536.

Meyyappan, M., et al; "Carbon nanotube growth by PECVD: a review"; Plasma Sources Sci. Technol. 12 (2003) pp. 205-216.

Milne, W.I., et al; "Carbon nanotubes as field emission sources"; Joural of Materials Chemistry, 2004, 14, pp. 933-943.

Seah, Choon-Ming, et al; "Synthesis of aligned carbon nanotubes"; Carbon (2011), doi:10.1016/j. carbon.2011.06.090.

Li, Yiming, et al; "Preferential Growth of Semiconducting Single-Walled Carbon Nanotubes by a Plasma Enhanced CVD Method"; Nano Letters 2004 vol. 4, No. 2, pp. 317-321.

Teo, K.B., et al; "Plasma enhanced chemical vapour deposition carbon nanotubes/nanofibres—how uniform do they grow?"; Nanotechnology 14 (2003), pp. 204-211.

Zhang, Guangyu, et al; "Selective Etching of Metallic Carbon Nanotubes by Gas-Phase Reaction"; Science 314, (2006); pp. 974-977.

\* cited by examiner

SYSTEM AND METHOD FOR MANUFACTURING CARBON NANOTUBES

RELATED APPLICATIONS

Not applicable

BACKGROUND OF THE INVENTION

1. Field of the Invention

This invention relates to the field of carbon nanotube formation utilizing chemical vapor deposition.

2. Related Art

Carbon nanotubes are allotropes of carbon which have many industrial applications. Carbon nanotubes are composed primarily of $sp^2$ bonds. These $sp^2$ bonds give them enhanced properties including thermal and electrical conductivity, and immense strength. The tensile strength of carbon nanotubes has been determined to be anywhere from a few Gigapascals (GPa) to over 100 GPa. Other materials such as steel alloys and Keviar® have a remarkably lower tensile strength range of roughly 0.4-5 GPa and 2.92-3.0 GPa, respectively.

Carbon nanotubes can be grown by a variety of methods including laser ablation, electric arc discharge, and plasma enhanced chemical vapor deposition. All of the above methods can produce carbon nanotubes with a high degree of structural integrity that are, at most, micrometers in length. The usefulness of carbon nanotubes increases immensely if they can be grown to macroscopic lengths. Various fauns of the chemical vapor deposition technique can produce macroscopic, millimeter and centimeter length carbon nanotubes, however, these nanotubes possess a low degree of structural integrity which causes their performance to be heavily degraded. Taking these observations into account, the biggest challenge facing researchers is the fact that they can only grow carbon nanotubes with a high degree of structural integrity at microscopic scales. In light of the foregoing, a need exists for an improved system and method for manufacturing carbon nanotubes with a high degree of structural integrity on a macroscopic scale.

BRIEF SUMMARY OF THE INVENTION

An object of the invention is to produce macro scale carbon nanotubes. Another object of the invention is to provide a system and method for manufacturing macro scale carbon nanotubes. Accordingly, a system and method for manufacturing carbon nanotubes by chemical vapor deposition is presented herein.

The system conducts chemical vapor deposition by utilizing a first chamber and a second chamber. Additionally, the system has at least one activation energy source, at least one alignment energy source, and a gas supply source. The first chamber has at least one cathode and at least one anode.

The second chamber is situated within the first chamber and has a target growth plate. The carbon nanotubes are grown on the target growth plate which has a substrate and a catalyst. The target growth plate is placed on a second cathode inside of the second chamber. The second cathode is situated upon a movable platform and is vertically opposed from a gas permeable barrier.

The foregoing brief summary is not an extensive overview of the claimed subject matter. Its sole purpose is to highlight elements of the claimed subject matter which are more thoroughly discussed in the detailed description below. The novel features which are believed to be characteristic of the invention together with further objects and advantages will be better understood from the following description when considered in connection with the accompanying figures. However, each of the figures is provided for the purposes of illustration of specific embodiments of the current invention and not to define the limits thereof.

DETAILED DESCRIPTION OF THE INVENTION

The claimed subject matter is described herein with reference to the figures, wherein common numerals are used to refer to elements throughout this disclosure. Many specific details are set forth below in order to provide a thorough understanding of the claimed subject matter. However, the present invention can be practiced without some or all of these specific details. Those skilled in the art will recognize many modifications may be made to this configuration without departing from the scope or spirit of the claimed subject matter.

The present invention can be described as a method of manufacturing carbon nanotubes utilizing a system 1 configured to conduct chemical vapor deposition. In the embodiment depicted in FIG. 1, the system 1 can have a first chamber 10 and a second chamber 20. A target growth plate 30 can be placed within the second chamber 20 for growth of carbon nanotubes.

Figure 1:
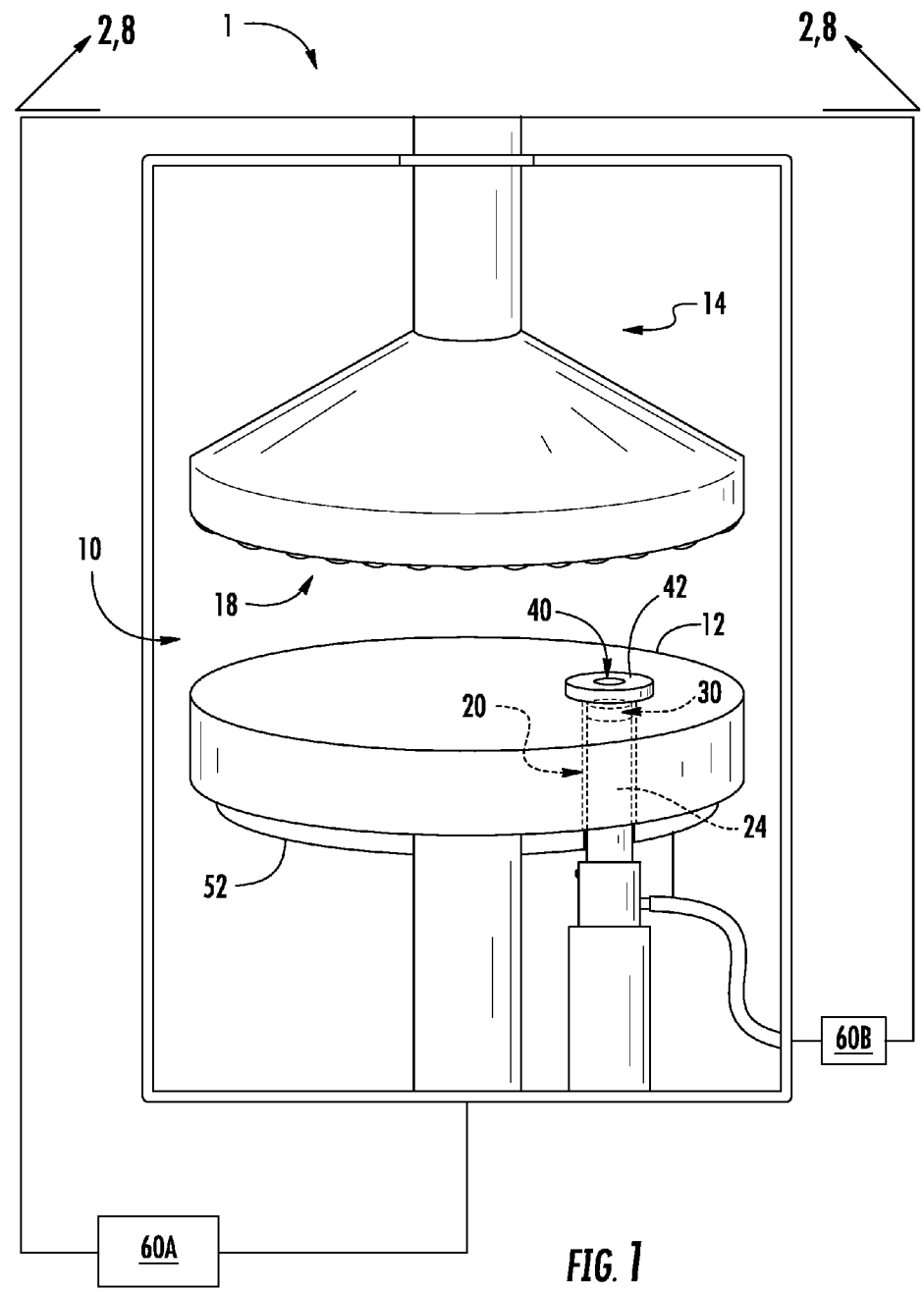
FIG. 1 is a perspective view of the system depicting an embodiment of the present invention
Figure 2:
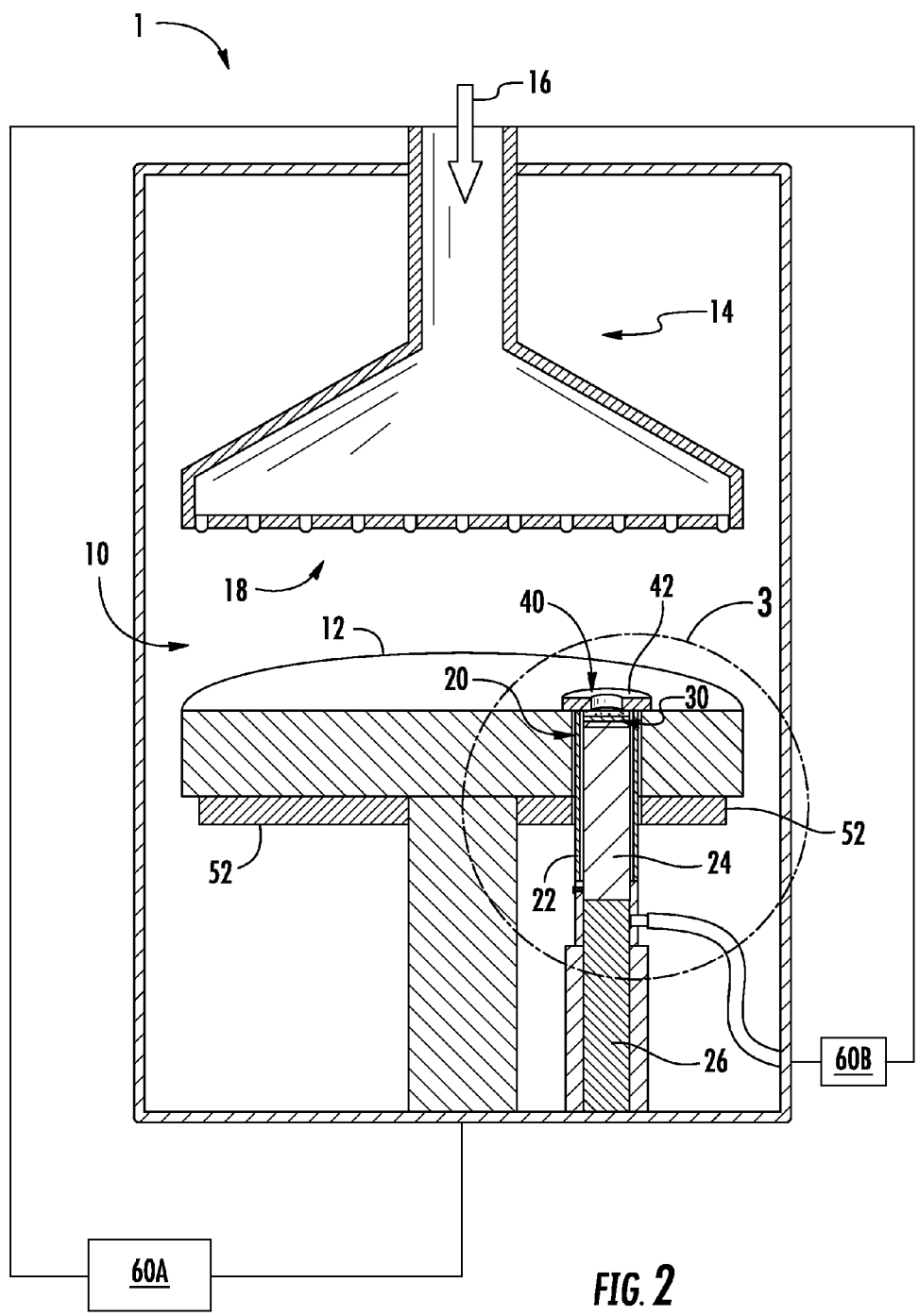
FIG. 2 is a cross section view of the system taken along section line 2-2 of FIG. 1 depicting an embodiment of the present invention.

The first chamber 10 can also have a first cathode 12 and an anode 14. In an embodiment of the present invention, the anode 14 can be a gas supply source 16 as seen in FIG. 2. Further, another embodiment of the present invention, the gas supply source 16 can be a showerhead 18, as seen in FIG. 1. In a particular embodiment, the showerhead 18 can supply a dilution gas to the first chamber 10. The dilution gas can be ammonium, argon, helium, hydrogen or water vapor. Additionally, the showerhead 18 can supply carbonaceous gas to the first chamber 10. In an embodiment of the present invention, the carbonaceous gas can be acetylene, benzene, butane, carbon monoxide, ethane, ethylene, ferrocene, methane or propane. In yet another embodiment of the present invention, the first chamber can be a vacuum chamber.

Figure 3A:
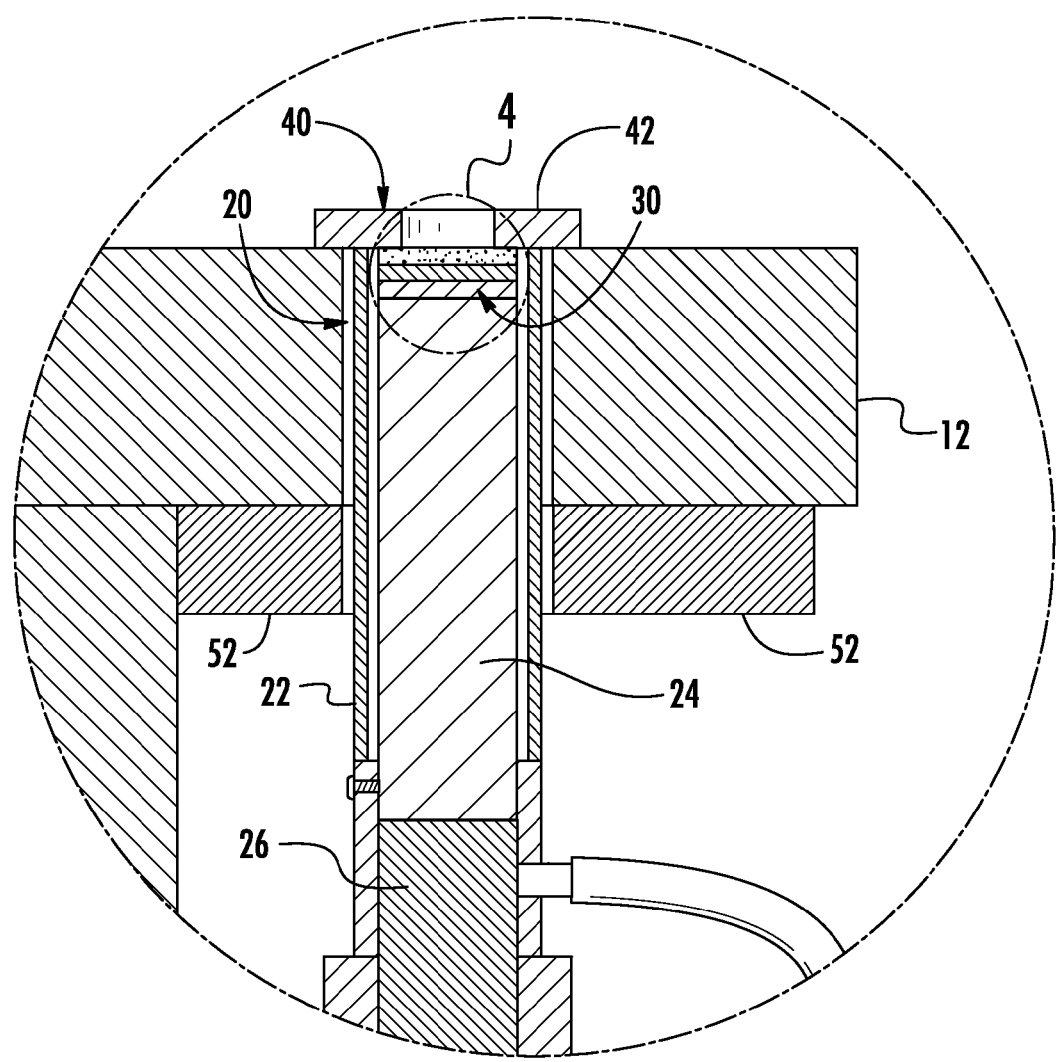
FIG. 3A is a detail view of circle 3 in FIG. 2 showing no growth of carbon nanotubes.
Figure 3B:
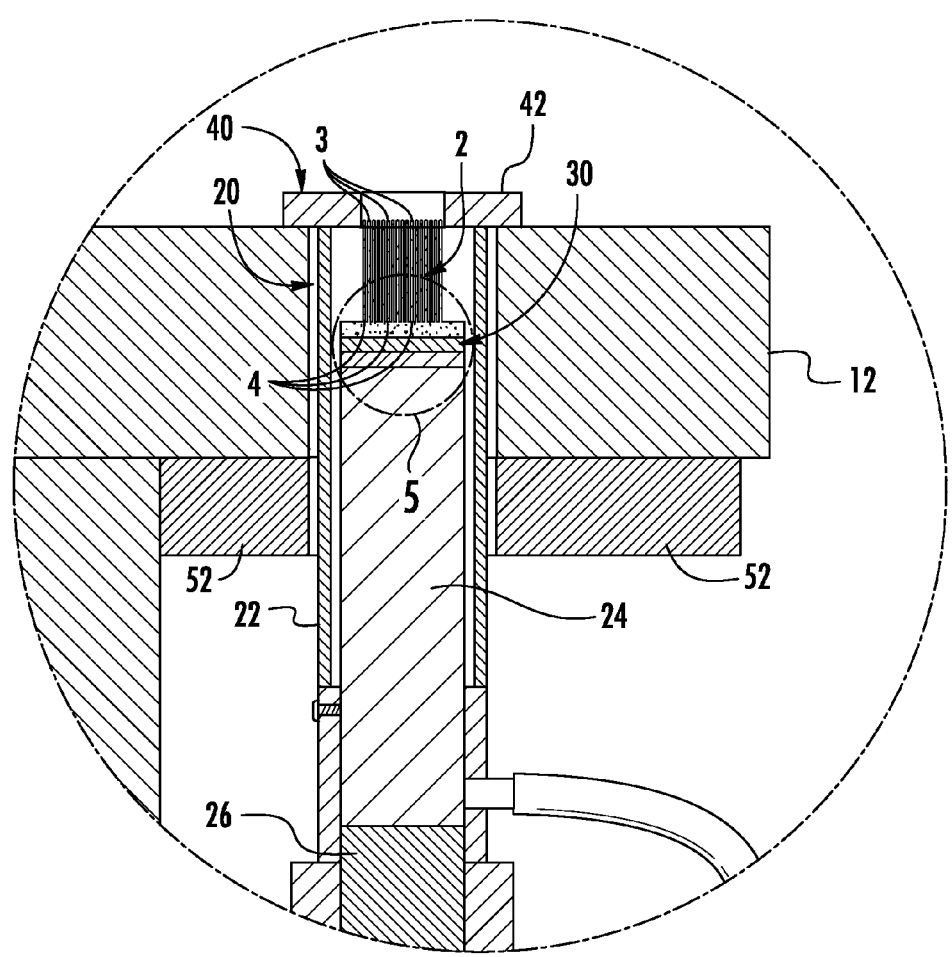
FIG. 3B is a detail view of circle 3 in FIG. 2 showing intermediate growth of carbon nanotubes.
Figure 3C:
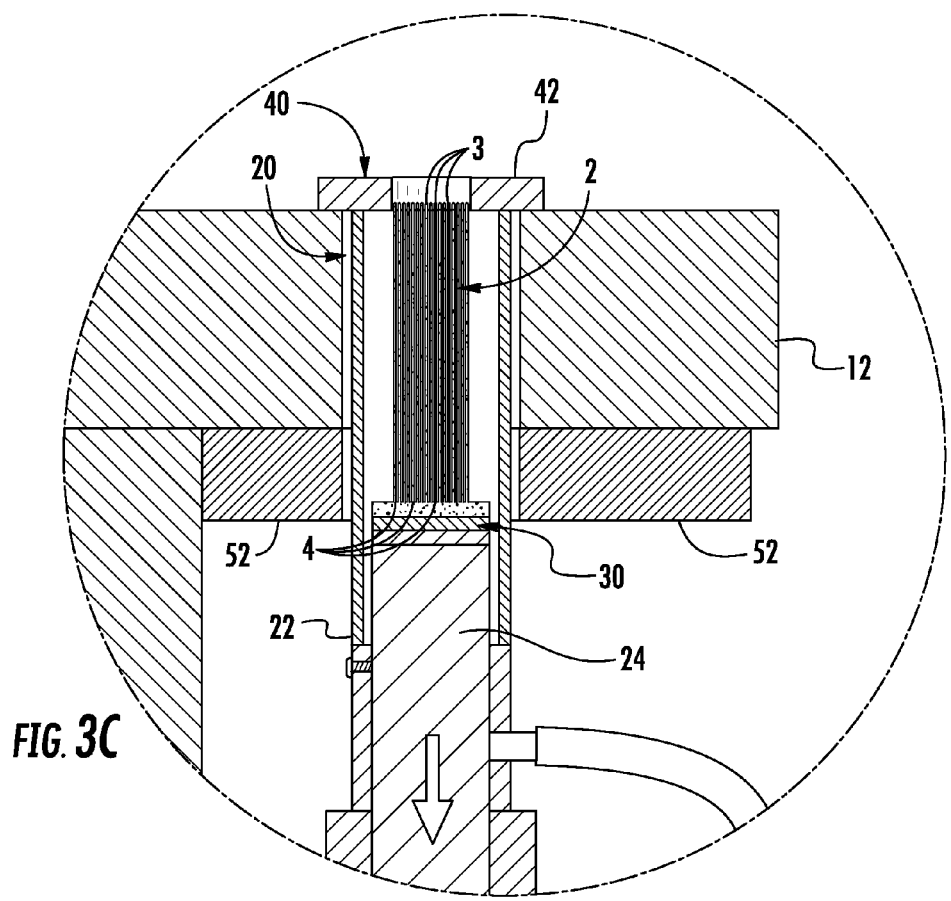
FIG. 3C is a detail view of circle 3 in FIG. 2 showing intermediate growth of carbon nanotubes.

The system 1 also comprises a second chamber 20. In an embodiment of the present invention, the second chamber 20 can be located within the first chamber 10. In yet another embodiment of the present invention, the second chamber 20 can be located within the first cathode 12. The second chamber 20 can be electrically isolated from the first cathode 12. In still another embodiment of the present invention, the second cathode 24 can be isolated from the first cathode 12 by using an isolator tube 22, as seen in FIGS. 3A, 3B, and 3C. The isolator tube 22 can be comprised of ceramic or quartz. The second chamber 20 can comprise a target growth plate 30. The second chamber 20 can also comprise a second cathode 24 which can be configured to support the target growth plate 30. Additionally, the second chamber 20 can comprise a movable platform 26 which can support the second cathode 24.

The second chamber 20 can also include a gas permeable barrier 40. In an embodiment of the present invention, the gas permeable barrier 40 can be a washer 42. The gas permeable barrier 40 can be comprised of conductive, semi-conductive, dielectric or insulative material. The gas permeable barrier 40 can be situated such that it contains the tips 3 of each of the plurality of carbon nanotubes 2. The movable platform 26 can be configured to move the second cathode 24 vertically and such that the tips 3 of each of the plurality of carbon nanotubes 2 remain within the gas permeable bather 40 as they grow.

Figure 4:
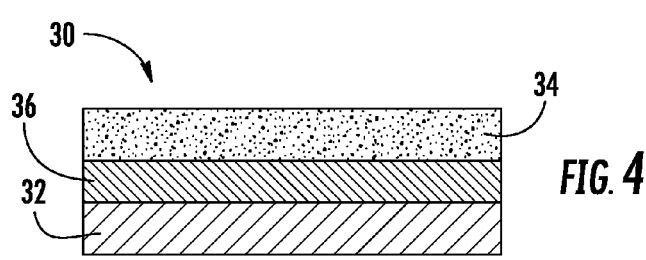
FIG. 4 is a detail view of circle 4 in FIG. 3A.

The target growth plate 30 can have a substrate 32 and a catalyst 34. In an embodiment of the present invention, the substrate 32 can be composed of steel, alumina, ceramic or silicon. The catalyst 34 can contain transition metal particles. Specifically, the catalyst 34 can be composed of cobalt, chromium, iron, magnesium, molybdenum, nickel, palladium, rhenium, rhodium, ruthenium, tin, and vanadium. In another embodiment, the target growth plate 30 can also have a diffusion inhibitor 36. The diffusion inhibitor 36 can be layered between the substrate 32 and the catalyst 34, as seen in FIG. 4. In an embodiment of the present invention, the diffusion inhibitor 36 can be indium tin oxide, aluminum, alumina ceramide, iridium, tantalum, titanium nitride, silicon dioxide, steel or tungsten.

Figure 8:
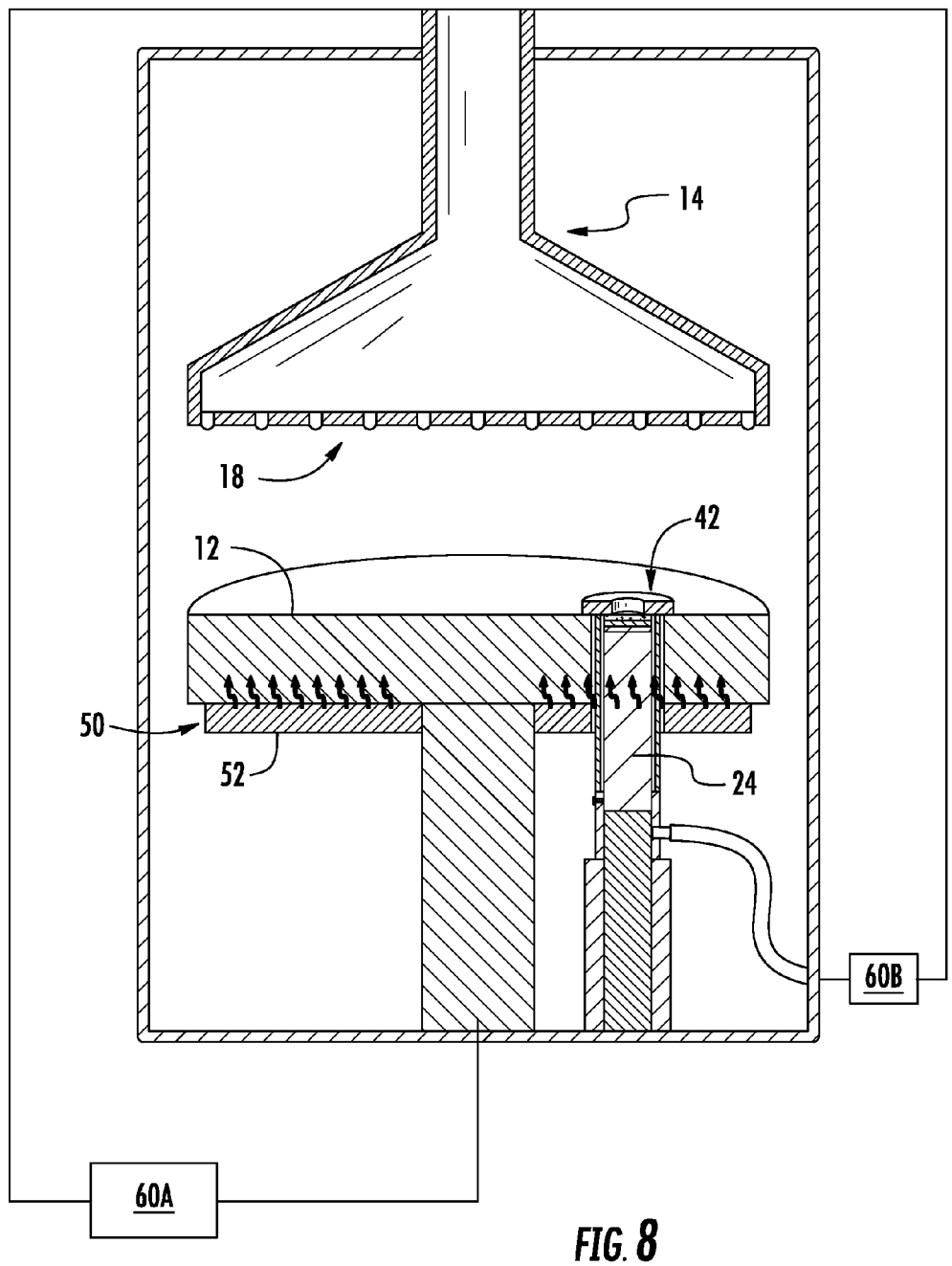
FIG. 8 is a cross section view of the system taken along section line 8-8 of FIG. 1 depicting an embodiment of the present invention utilizing heat as the activation energy.

The system 1 can also comprise an activation energy source 50. The activation energy can be heat, microwaves, radiowaves, or magnetic waves. In a particular embodiment of the present invention, the activation energy source 50 can be a heater 52 as depicted in FIG. 8. The activation energy source 50 will be configured to supply adequate energy to the second cathode 24 such that the catalyst 34 will melt into islands 38 from which the carbon nanotubes 2 grow.

In an embodiment of the present invention, at least one alignment energy source 60 is configured to maintain the system 1 at a pre-plasma ignition voltage, which is a voltage less than that required to ignite plasma between the first cathode 12 and the anode 14 and between the second cathode 24 and the anode 14. The voltage necessary to ignite plasma depends upon the distance between the first cathode 12 or the second cathode 24 and the anode 14, the pressure of the gas, and the types of carbonaceous and dilution gases selected. The pre-plasma ignition voltage of the system 1 can be calculated using Paschen's law, $V=apd/\ln(pd)+b$, where, V is the breakdown voltage, p is the pressure, d is the gap distance, and a and b are gas-specific constants.

Further, the system 1 can also comprise alignment energy sources 60 which can maintain alignment of carbon nanotubes 2 grown in the system 1 by utilizing the electric fields emitted by the tips 3 of the carbon nanotubes 2 and the gas permeable barrier 40. In an embodiment of the present invention, a first alignment energy source 60A supplies alignment energy to the first cathode 12 which transfers the alignment energy to the gas permeable barrier 40. Additionally, a second alignment energy source 60B supplies alignment energy to the second cathode 24. The alignment energy sources 60 can be any energy source capable of supplying direct current electrical power.

The operation of the method in accordance with this invention will now be described in relation to various embodiments. These embodiments are but examples of some of the forms in which the invention may be practiced. It is to be understood that these embodiments are not intended to be exhaustive, nor limiting of the invention.

In one embodiment of the present invention, the system 1 can be utilized to manufacture carbon nanotubes 2 by chemical vapor deposition. To begin, the catalyst 34 is applied to the substrate 32. In yet another embodiment, the diffusion inhibitor 36 is applied to the substrate 32 before the catalyst 34 is applied. In one embodiment, the substrate 32 can be a steel wafer, the diffusion inhibitor 36 can be indium tin oxide, and the catalyst 34 can be nickel. In this embodiment, the substrate 32 is placed in a sputter coater machine which can apply the diffusion inhibitor 36 and then the catalyst 34 creating the target growth plate 30.

In addition to a sputter coater machine, the diffusion inhibitor 36 and the catalyst 34 can be deposited onto substrate 32 by any method which will create a target growth plate 30 that will prevent the catalyst 34 from diffusing into substrate 32 when subjected to the energy required for chemical vapor deposition. In yet another embodiment of the present invention, the substrate 32 will be a steel wafer coated with a layer of indium tin oxide, the diffusion inhibitor 36, which is approximately 150 nanometers thick; then, a layer of nickel, the catalyst 34, is applied which is approximately 25 nanometers thick.

In still another embodiment, the target growth plate 30 can be prepared using nanolithography to create a target growth plate 30 with a manually spaced catalyst 34 upon the substrate 32. In this embodiment, the substrate 32 can be silicon. In this embodiment, the user can determine the pattern of the catalyst 34 upon the growth plate thereby determining the array density of carbon nanotubes 2. In yet another embodiment, the target growth plate 30 can be prepared using positive resist electron nanolithography.

Figure 6:
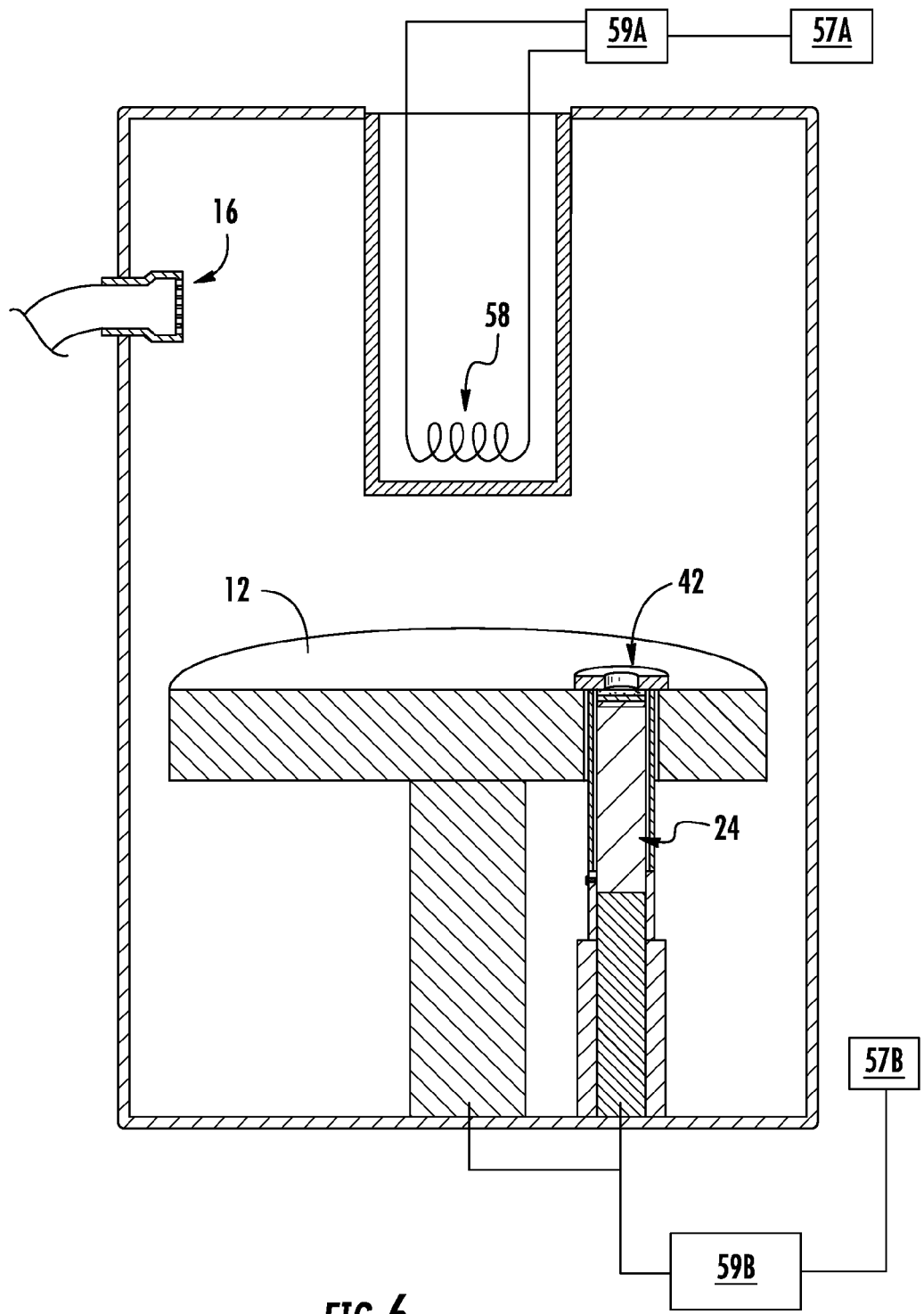
FIG. 6 is a detail view of the interior of the system depicting an embodiment of the present invention utilizing magnetic waves as the activation energy.
Figure 7:
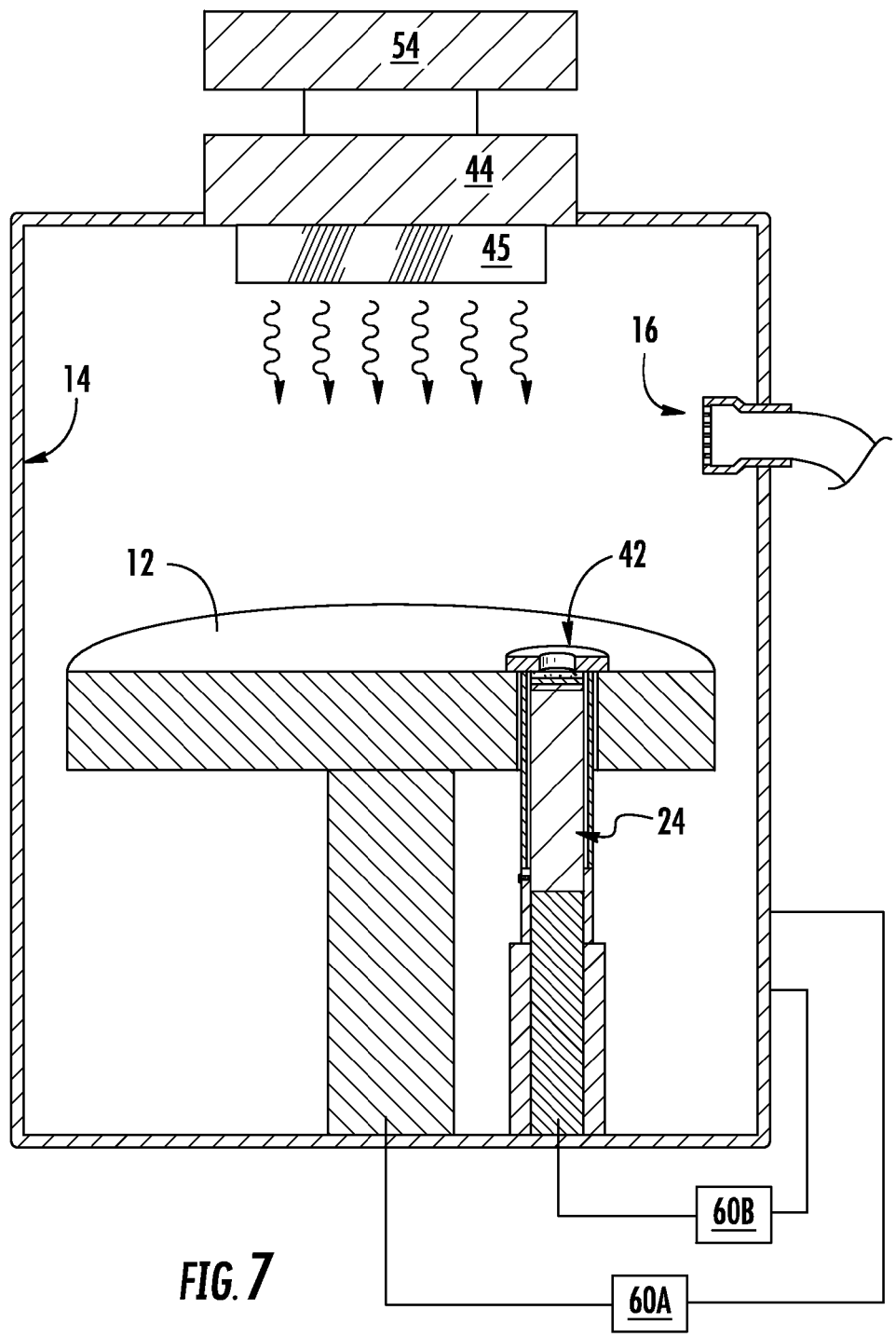
FIG. 7 is a detail view of the interior of the system depicting an embodiment of the present invention utilizing microwaves as the activation energy.

When the target growth plate 30 has been prepared, it can then be placed upon the second cathode 24 within the second chamber 20. The isolator tube 22 should be installed such that the second cathode 24 is electrically isolated from the first cathode 12, as seen in FIGS. 6, and 7. In the present embodiment, the system 1 is evacuated of atmospheric pressure. In a further embodiment, the system 1 is evacuated of atmospheric pressure until the pressure inside the system 1 is approximately $10^{-2}$ millibar.

Figure 5:
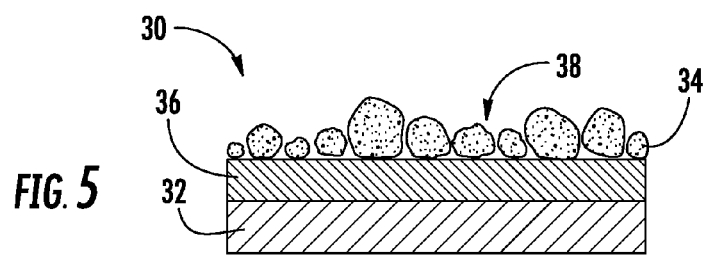
FIG. 5 is a detail view of circle 5 in FIG. 3B.

In one embodiment of the present invention, the activation energy source 50 can be a heater 52, as seen in FIG. 8. The heater 52 can be an electrically resistive graphite heater and can be coated in pyrolytic boron nitride. Additionally, the heater 52 can be located beneath the first cathode 12, as seen in FIGS. 1 and 8. The heater 52 can be powered by alternating current power. In yet another embodiment, the heater 52 can be configured such that the heater 52 surrounds the second cathode 24 and insulator tube 22, as seen in FIGS. 6 and 7. The heater 52 will be enabled such that the target growth plate 30 will reach a temperature between about 600 degrees Celsius and about 1000 degrees Celsius. When the target growth plate 30 reaches a temperature between about 600 degrees Celsius and about 1000 degrees Celsius, the catalyst 34 will anneal and form islands 38 upon the target growth plate 30, as seen in FIG. 5. In one embodiment, the heater 52 will be maintained at approximately 800 degrees Celsius.

After the heater 52 has reached the desired temperature between about 600 degrees Celsius and about 1000 degrees Celsius, the first alignment energy source 60A and the second alignment energy source 60B can be activated. In one embodiment, first alignment energy source 60A and/or second alignment energy source 60B can be a direct current power source. The alignment energy sources 60 will be activated to reach a pre-plasma ignition voltage as defined by Paschen's law. In one embodiment, the highest voltage before plasma ignition will be used. The alignment energy source 60B connected to the second cathode 24 will cause electric fields to be emitted from the tips 3 of the carbon nanotubes 2. The interactions of the electric fields at the tips 3 will cause the carbon nanotubes 2 to align.

The alignment energy source 60A will supply energy to the first cathode 12 such that the gas permeable barrier 40 will be charged. The carbon nanotubes 2 at the edge of the array will interact with the gas permeable barrier 40, and the gas permeable barrier 40 will prevent carbon nanotubes 2 from growing sideways and maintain their vertical alignment. In another embodiment, the alignment energy source 60B connected to the second cathode 24 charges the catalyst islands 38 which repels them away from the surface of the diffusion barrier 36 resulting in nanotubes 2 grown via their tips 3.

Once the heater 52 and the alignment energy sources 60 have been activated and the system 1 has reached the desired temperature and voltage level, the gas supply source 16 will supply a dilution gas and a carbonaceous gas. The dilution gas can be any gas that slows the reaction between the carbonaceous gas and the catalyst 34 to reduce carbon buildup which obstructs carbon nanotube 2 formation. In one embodiment, the gas supply source 16 can be a showerhead 18 located on the anode 14. The showerhead 18 can supply ammonia as the dilution gas at a rate of about 80 Standard Cubic Centimeters per minute. The showerhead 18 can also supply acetylene as the carbonaceous gas at a rate of about 20 Standard Cubic Centimeters per minute. Following introduction of the carbonaceous and dilution gases, the operating pressure of the system should be about 6 millibar.

Carbon nanotubes 2 will begin to grow as the carbonaceous gas enters the system 1. Specifically, the carbon nanotubes 2 will grow when the carbonaceous gas passes through the gas permeable barrier and reacts with the catalyst 34. The carbon nanotubes 2 will grow via tip growth from the islands 38, as seen in FIGS. 3B and 3C. The carbon nanotubes 2 will grow vertically as the distance between the second cathode 24 and the anode 14 grows. In one embodiment, the movable platform 26 lowers as the carbon nanotubes 2 grow keeping the tips 3 of the carbon nanotubes 2 within the washer 42 as they grow vertically, as seen in FIGS. 6 and 7.

Figure 9:
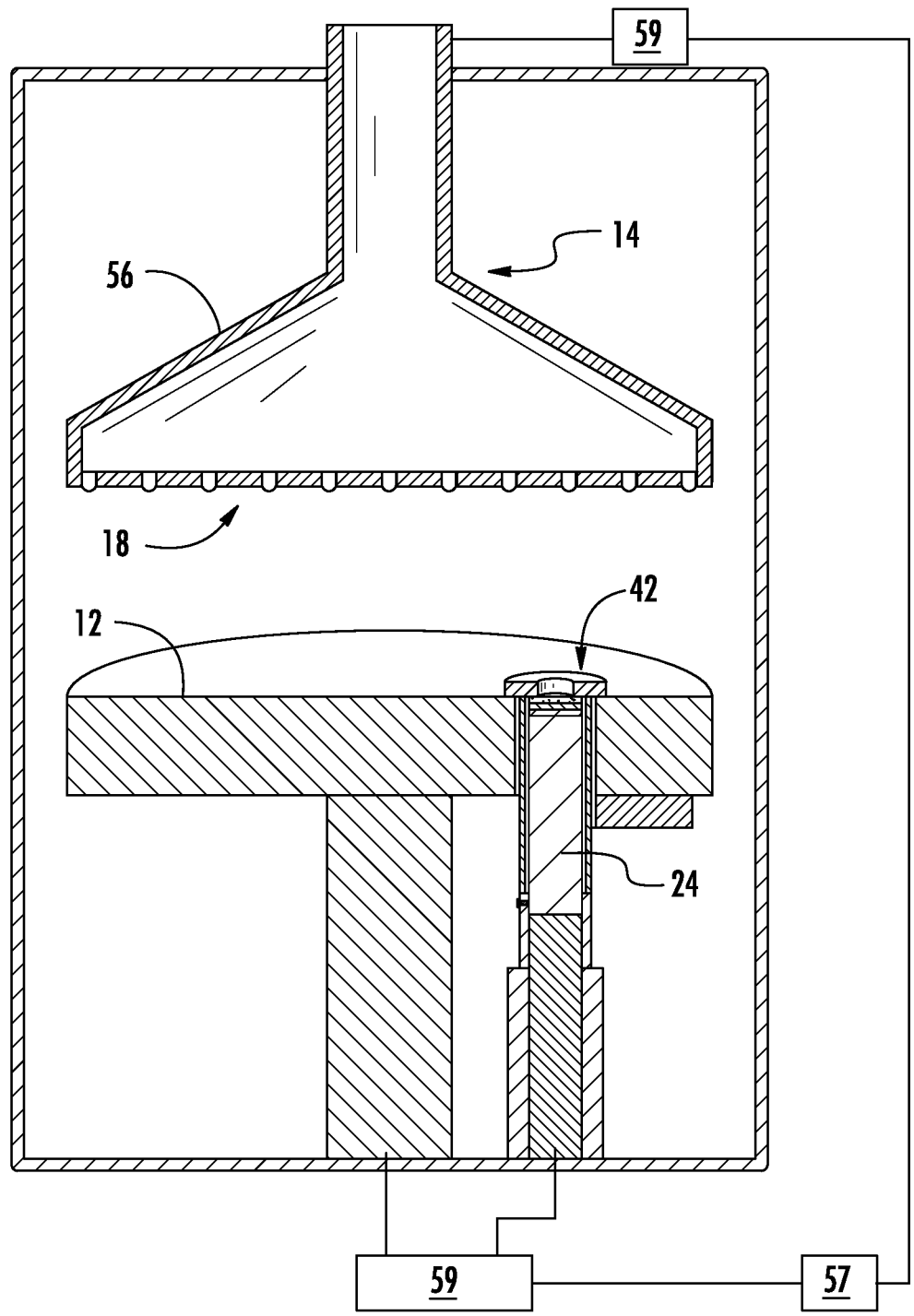
FIG. 9 is a detail view of the interior of the system depicting an embodiment of the present invention utilizing radio waves as the activation energy.

In yet another embodiment of the present invention, the activation energy can be radio waves. Looking to FIG. 9, the activation energy source 50 can be an antenna 56 located within the system 1. The antenna 56 can be connected to a radio frequency power supply 57 operatively connected to at least one matching network 59, as seen in FIG. 9. The optimal operation range for the radio waves will be between about 13.56 MegaHertz and about 4 GigaHertz and about 50 to about 500 watts. The radio waves are emitted in pulses such that a plasma is briefly formed and not perpetually present. If radio waves are the activation energy, the alignment energy sources 60 will be engaged before the activation energy source 50. Then, the dilution gas will be released into the system 1. Next, the carbonaceous gas will be released into the system 1 to facilitate the growth of carbon nanotubes 2 on target growth plate 30.

In still another embodiment of the present invention, the activation energy can be microwaves. As seen in FIG. 7, if microwaves are the activation energy, the activation energy source 50 can be a microwave power supply 54 which uses a waveguide 44 with a quartz window 45 located within the system 1 to introduce microwaves. If microwaves are the activation energy, the alignment energy sources 60 will be engaged before the activation energy source 50. The microwaves are emitted in pulses such that a plasma is briefly formed and not perpetually present. Next, the alignment energy sources 60 will be engaged. Then, the dilution gas will be released into the system 1. Next, the carbonaceous gas will be released into the system 1 to facilitate the growth of carbon nanotubes on target growth plate 30.

In a further embodiment of the present invention, the activation energy can be magnetic waves. If magnetic waves are the activation energy, the activation energy source 50 can be a system that uses radio frequency inductive coupling in conjunction with radio frequency capacitive coupling to produce a plasma within system 1, as seen in FIG. 6. A radio frequency power supply 57A is operatively connected to a matching network 59A which supplies energy a coil 58 which produces magnetic waves. A second radio frequency power supply 57B can be operatively connected to a second matching network 59B. The magnetic waves are emitted in pulses such that a plasma is briefly formed and not perpetually present. If magnetic waves are the activation energy, the alignment energy sources 60 will be engaged before the activation energy sources 60. Then, the dilution gas will be released into system 1 followed by the carbonaceous gas to facilitate the growth of carbon nanotubes on growth plate 30.

Any reference to patents, documents and other writings contained herein shall not be construed as an admission as to their status as prior art. Although the present invention and its advantages have been described in detail, it is understood that the array of features and embodiments taught herein may be combined and rearranged in a large number of additional combinations not directly disclosed, as will be apparent to one having ordinary skill in the art.

Moreover, it should be understood that various changes, substitutions, and alterations can be made herein without departing from the spirit and scope of the invention as defined by the following claims. There are, of course, alternate embodiments intended to be included within the scope of the invention, as defined by the following claims.

I claim:

1. A system for manufacturing carbon nanotubes by chemical vapor deposition comprising:
   a. a first chamber comprising at least one cathode and at least one anode;
   b. a gas supply source;
   c. at least one activation energy source;
   d. at least one alignment energy source;
   e. a second chamber situated within said first chamber, said second chamber comprising:
      i. a target growth plate, comprising a catalyst and a substrate;
      ii. a second cathode configured to support said target growth plate;
      iii. a movable platform configured to support said second cathode;
      iv. a gas permeable barrier vertically opposed from said second cathode.

2. The system for manufacturing carbon nanotubes according to claim 1 wherein said first chamber is a vacuum chamber.

3. The system for manufacturing carbon nanotubes according to claim 1 wherein said activation energy source transmits energy in form of heat.

4. The system for manufacturing carbon nanotubes according to claim 1 wherein said activation energy source transmits energy in the form of radio waves.

5. The system for manufacturing carbon nanotubes according to claim 1 wherein said activation energy source transmits energy is form of microwaves.

6. The system for manufacturing carbon nanotubes according to claim 1 wherein said activation energy source transmits energy in the form of magnetic waves.

7. The system for manufacturing carbon nanotubes according to claim 1 wherein said gas supply source is a shower head.

8. The system for manufacturing carbon nanotubes according to claim 1 wherein said gas supply source is configured to supply a dilution gas.

9. The system for manufacturing carbon nanotubes according to claim 1 wherein said gas supply source is configured to supply a carbonaceous gas.

10. The system for manufacturing carbon nanotubes according to claim 1 wherein said second chamber is within said first cathode.

11. The system for manufacturing carbon nanotubes according to claim 10 wherein said second chamber is electrically insulated from said first cathode.

12. The system for manufacturing carbon nanotubes according to claim 1 wherein said target growth plate further comprises a diffusion inhibitor.

13. The system for manufacturing carbon nanotubes according to claim 12 wherein said catalyst comprises at least one transition metal.

14. The system for manufacturing carbon nanotubes according to claim 1 wherein said gas permeable barrier is a washer.

15. The system for manufacturing carbon nanotubes according to claim 1 wherein said system comprises a first alignment energy source and a second alignment energy source.

16. The system for manufacturing carbon nanotubes according to claim 15 wherein said first alignment energy source is operatively connected to said first cathode and said second alignment energy source is operatively connected to said second cathode.

17. The system for manufacturing carbon nanotubes according to claim 3 wherein the system is maintained at a temperature from about 600 degrees Celsius to about 1000 degrees Celsius.

18. A method of manufacturing carbon nanotubes by chemical vapor deposition utilizing a system comprising: a first chamber comprising at least one cathode and at least one anode; a gas supply source; at least one activation energy source; at least one alignment energy source; a second chamber situated within said first chamber, said second chamber comprising: a target growth plate, comprising a catalyst and a substrate; a second cathode configured to support said target growth plate; a movable platform configured to support said second cathode; and a gas permeable barrier vertically opposed from said second cathode, said method comprising:
 a. applying said catalyst to said substrate to form said target growth plate;
 b. positioning said target growth plate inside of said second chamber upon said second cathode and said movable platform;
 c. initiating said activation energy source;
 d. initiating said alignment energy source;
 e. utilizing said gas supply source such that a plurality of carbon nanotubes are formed on said target growth plate, each of said plurality of carbon nanotubes comprising a base and a tip;
 f. maintaining the energy of said first chamber and said second chamber at a pre-plasma ignition voltage;
 g. lowering said platform to maintain said tips of said plurality of carbon nanotubes within said barrier.

19. The method of manufacturing carbon nanotubes according to claim 18 wherein said first chamber is a vacuum chamber.

20. The method of manufacturing carbon nanotubes according to claim 18 wherein said activation energy source transmits energy in form of heat.

21. The method of manufacturing carbon nanotubes according to claim 18 wherein said activation energy source transmits energy in the form of radio waves.

22. The method of manufacturing carbon nanotubes according to claim 18 wherein said activation energy source transmits energy in the form of microwaves.

23. The method of manufacturing carbon nanotubes according to claim 18 wherein said activation energy source transmits energy in the form of magnetic waves.

24. The method of manufacturing carbon nanotubes according to claim 18 wherein said gas supply source is a shower head.

25. The method of manufacturing carbon nanotubes according to claim 18 wherein said gas supply source is configured to supply a dilution gas.

26. The method of manufacturing carbon nanotubes according to claim 18 wherein said gas supply source is configured to supply a carbonaceous gas.

27. The method of manufacturing carbon nanotubes according to claim 18 wherein said second chamber is within said first cathode.

28. The method of manufacturing carbon nanotubes according to claim 27 wherein said second chamber is electrically insulated from said first cathode.

29. The method of manufacturing carbon nanotubes according to claim 18 wherein said target growth plate further comprises a diffusion inhibitor.

30. The method of manufacturing carbon nanotubes according to claim 29 wherein said catalyst comprises at least one transition metal.

31. The method of manufacturing carbon nanotubes according to claim 18 wherein said gas permeable barrier is a washer.

32. The method of manufacturing carbon nanotubes according to claim 18 wherein said system comprises a first alignment energy source and a second alignment energy source.

33. The method of manufacturing carbon nanotubes according to claim 32 wherein said first alignment energy source is operatively connected to said first cathode and said second alignment energy source is operatively connected to said second cathode.

34. The method of manufacturing carbon nanotubes according to claim 20 wherein the system is maintained at a temperature from about 600 degrees Celsius to about 1000 degrees Celsius.

* * * * *